United States Patent
Kwon et al.

(10) Patent No.: US 8,053,845 B2
(45) Date of Patent: Nov. 8, 2011

(54) SEMICONDUCTOR DEVICE INCLUDING DUMMY GATE PART AND METHOD OF FABRICATING THE SAME

(75) Inventors: Byoung-ho Kwon, Hwaseong-si (KR); Sang-youn Jo, Suwon-si (KR); Jin-sook Choi, Suwon-si (KR); Chang-ki Hong, Seongnam-si (KR); Bo-un Yoon, Seoul (KR); Hong-soo Kim, Yongin-si (KR); Se-rah Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/291,211

(22) Filed: Nov. 7, 2008

(65) Prior Publication Data

US 2009/0121296 A1    May 14, 2009

(30) Foreign Application Priority Data

Nov. 8, 2007  (KR) .................. 10-2007-0113719

(51) Int. Cl.
*H01L 21/70* (2006.01)
(52) U.S. Cl. ........ 257/390; 257/365; 257/368; 257/389; 438/587; 438/626
(58) Field of Classification Search .................. 257/390, 257/368, 288, E27.01, 775, 773, 389, 365, 257/367, 350, 409, 407, E27.07; 438/587, 438/626

See application file for complete search history.

(56) References Cited

U.S. PATENT DOCUMENTS

| | | | |
|---|---|---|---|
| 2005/0285204 A1* | 12/2005 | Kim et al. | 257/368 |
| 2006/0128082 A1* | 6/2006 | Chuang et al. | 438/183 |
| 2006/0255394 A1 | 11/2006 | Park | |
| 2007/0117321 A1 | 5/2007 | Park | |

FOREIGN PATENT DOCUMENTS

| | | |
|---|---|---|
| KR | 10-2001-0038611 | 5/2001 |
| KR | 2002-0036384 | 5/2002 |
| KR | 10-0632655 | 9/2006 |

* cited by examiner

*Primary Examiner* — Lynne Gurley
*Assistant Examiner* — Naima Kearney
(74) *Attorney, Agent, or Firm* — Onello & Mello, LLP

(57) ABSTRACT

In a reliable semiconductor device and a method of fabricating the semiconductor device, a difference in height between upper surfaces of a cell region and a peripheral region (also referred to as a level difference) is minimized by optimizing dummy gate parts. The semiconductor device includes a semiconductor substrate including a cell region and a peripheral region surrounding the cell region, a plurality of dummy active regions surrounded by a device isolating region and formed apart from each other, and a plurality of dummy gate parts formed on the dummy active regions and on the device isolating regions located between the dummy active regions, wherein each of the dummy gate parts covers two or more of the dummy active regions.

9 Claims, 5 Drawing Sheets

SEMICONDUCTOR DEVICE INCLUDING DUMMY GATE PART AND METHOD OF FABRICATING THE SAME

CROSS-REFERENCE TO RELATED PATENT APPLICATION

This application claims the benefit of Korean Patent Application No. 10-2007-0113719, filed on Nov. 8, 2007, in the Korean Intellectual Property Office, the contents of which are incorporated herein in their entirety by reference.

BACKGROUND OF THE INVENTION

1. Field of the Invention

The present invention relates to a semiconductor device, and more particularly, to a semiconductor device, in which a dummy gate part is formed in a peripheral region, and a method of fabricating the same.

2. Description of the Related Art

As semiconductor devices continue to be more densely integrated, individual circuit patterns are becoming more densely arranged to attempt to include more semiconductor devices within the same area. The high density of circuit patterns causes various problems during manufacturing of semiconductor devices, and thus new methods of manufacturing semiconductor devices are being developed.

Generally, in the manufacture of a semiconductor device, a gate pattern is formed on a semiconductor substrate, an interlayer insulation layer is formed on the gate pattern, and a circuit layer is formed on the interlayer insulation layer. To form the circuit layer on an even interlayer insulation layer, chemical mechanical polishing (CMP) is performed on the interlayer insulation layer after the interlayer insulation layer is formed. However, due to the formation of gate patterns in a cell region, the interlayer insulation layer will not be level with a peripheral region even after CMP. If a pattern corresponding to the circuit pattern is formed on the interlayer insulation layer, it may cause a defective pattern due to the lack of a defocus margin.

Therefore, a dummy gate part is formed in the peripheral region, which corresponds to a real gate parts in the cell region, to prevent the aforementioned problem.

FIGS. 1 through 3 are sectional views illustrating a manufacturing process of a semiconductor device having a dummy gate part of the prior art.

Referring to FIG. 1, the top surface of a semiconductor device 10 is divided into two regions: a cell region C having formed thereon semiconductor memory devices and a peripheral region P formed around the cell region C and having formed thereon some control devices and dummy devices. In the cell region C, a real active region 11a is formed, surrounded and defined by a device isolating region 12. Also, a plurality of dummy active regions 11c, surrounded and defined by the device isolating region 12, and some real active regions 11b are formed. Also, a plurality of real gate parts 14a, which form semiconductor devices, are formed on the semiconductor substrate 10 in the cell region C by having a gate insulation layer (not shown) therebetween. A plurality of dummy gate parts 14c are also formed on the semiconductor substrate 10 in the peripheral region P by having a gate insulation layer (not shown) there-between. As needed, some real gate parts 14b may also be formed on the semiconductor substrate 10 in the peripheral region P.

The dummy gate parts 14c formed in the peripheral region P are formed in correspondence to the real gate parts 14a only to decrease a difference in height between upper surfaces of the cell region C and the peripheral region P (herein referred to as "a level difference"), and are insulated from surrounding conductive layers by a insulating material layer. Also, each of the dummy gate parts 14c is formed on each of the dummy active regions 11c, respectively. When impurity ions are implanted to the real active region 11a in the cell region C, the impurity ions may also be undesirably implanted to the dummy active regions 11c in the peripheral region P, and thus the dummy gate parts 14c are formed so that each dummy gate part 14c covers a corresponding dummy active region 11c.

Referring to FIG. 2, a thick interlayer insulation layer 16 is formed on the semiconductor substrate 10, on which the real gate parts 14a and the dummy gate parts 14c are formed. While the interlayer insulation layer 16 in the cell region C is evenly formed due to high density of the real gate parts 14a, the interlayer insulation layer 16 in the peripheral region P is formed unevenly because relatively more of the material forming the interlayer insulation layer fills spaces between the dummy gate parts 14c, formed at a density lower than that of the real gate parts 14a. Thus, there may be many sunken parts on the surface of the interlayer insulation layer 16 in the peripheral region P.

Referring to FIG. 3, CMP is performed on the interlayer insulation layer 16 to form an even top surface. Since the density of the real gate parts 14a in the cell region C is larger than the density of the dummy gate parts 14c in the peripheral region P, a level difference t at right side is created.

Therefore, a circuit layer or another interlayer insulation layer (not shown), which is to be formed on the interlayer insulation layer, cannot be formed evenly due to the level difference t between the cell region C and the peripheral region P, and thus the unevenness may cause a defective pattern in the formation of circuit patterns.

SUMMARY OF THE INVENTION

The present invention provides a semiconductor device, in which a difference in height between upper surfaces of a cell region and a peripheral region (herein referred to as level difference) can be decreased by forming dummy gate parts in the peripheral region, and a method of fabricating the semiconductor device, to resolve problems which occur in the prior art.

The present invention also provides a reliable semiconductor device, in which the level difference between a cell region and a peripheral region is minimized by optimizing dummy gate parts, and a method of fabricating the semiconductor device.

According to an aspect of the present invention, there is provided a semiconductor device including a semiconductor substrate comprising a cell region and a peripheral region surrounding the cell region, a plurality of dummy active regions surrounded by a device isolating region in the peripheral region and formed apart from each other, and at least one dummy gate part which is formed on the device isolating region on the dummy active regions formed adjacent to each other and covers two or more of the dummy active regions.

In one embodiment, real gate parts are formed in the cell region in correspondence to the dummy gate part in the peripheral region, and the real gate parts and the dummy gate part may be formed of the same material. The dummy active regions may be covered by the dummy gate part so that the dummy active regions are not exposed outside the dummy gate part.

The dummy active regions may have a rectangular pattern, and the dummy gate parts may have a stripe pattern in correspondence to the dummy active regions. Alternatively, the dummy active regions may have a pattern of a plurality of islands, and the dummy gate part may have a rectangular panel shape covering the dummy active regions in the island shapes.

At least one real active region and at least one real gate part in correspondence to the real active region may further be formed in the peripheral region. Alternatively, at least a dummy active region and at least a dummy gate part in correspondence to the dummy active region may be formed in the cell region.

According to another aspect of the present invention, there is provided a method of fabricating a semiconductor device, the method including providing a semiconductor substrate, forming a cell region and a peripheral region surrounding the cell region, both of which are defined by device isolating region, and forming a plurality of dummy active regions in the peripheral region, the dummy active regions being surrounded by the device isolating region and being formed apart from each other, forming a gate part forming material layer over the semiconductor substrate, forming from the gate part forming material layer a plurality of real gate parts in the cell region and forming from the gate part forming material layer dummy gate parts on the device isolating region on the dummy active regions in the peripheral region, each of the dummy gate parts covering two or more of the dummy active regions, forming an interlayer insulation layer over the semiconductor substrate, and flattening the surface of the interlayer insulation layer.

The method may further include implanting impurity ions to the semiconductor substrate after forming the real gate parts and the dummy gate parts, wherein the dummy gate parts may function as an ion-implanting mask such that the impurity ions are not implanted to the dummy active regions.

In one embodiment, the dummy active regions are formed to have a linear pattern, and the dummy gate parts are formed to have a linear pattern in correspondence to the dummy active regions.

In one embodiment, the dummy active regions are formed to have a pattern of a plurality of islands in a matrix, and the dummy gate parts are formed to have a rectangular panel shape covering the dummy active regions in the island pattern.

In one embodiment, the method further comprises: forming real active regions in the peripheral region; and forming real gate parts in correspondence to the real active regions, in the peripheral region.

In one embodiment, the method further comprises: forming dummy active regions in the cell region; and forming dummy gate parts in correspondence to the dummy active regions, in the cell region.

In one embodiment, the flattening of the interlayer insulation layer is performed using a CMP (chemical mechanical polishing) method.

The overall surface area of the dummy gate parts may be controlled to decrease density difference between the real gate parts in the cell region and the dummy gate parts in the peripheral region.

According to the present invention, the density of dummy gate parts can be controlled freely as occasion demands when the density of dummy active region is optimized, and thus the level difference between certain material layers on a semiconductor substrate can be decreased.

According to the present invention, the density of dummy active regions can be maintained within proper range without concerning the controlling density of dummy gate parts, and thus a shallow trench isolation (STI) operation can be performed smoothly.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Figure 1:
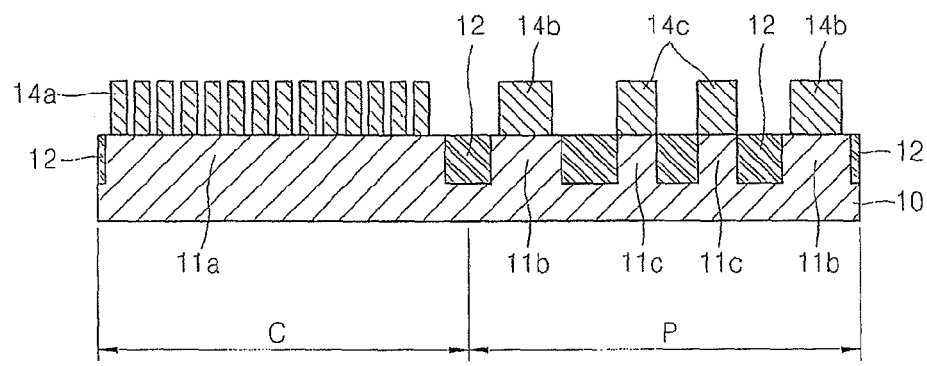
FIGS. 1 through 3 are sectional views illustrating a process for manufacturing a semiconductor device having a dummy gate part in the prior art.
Figure 2:
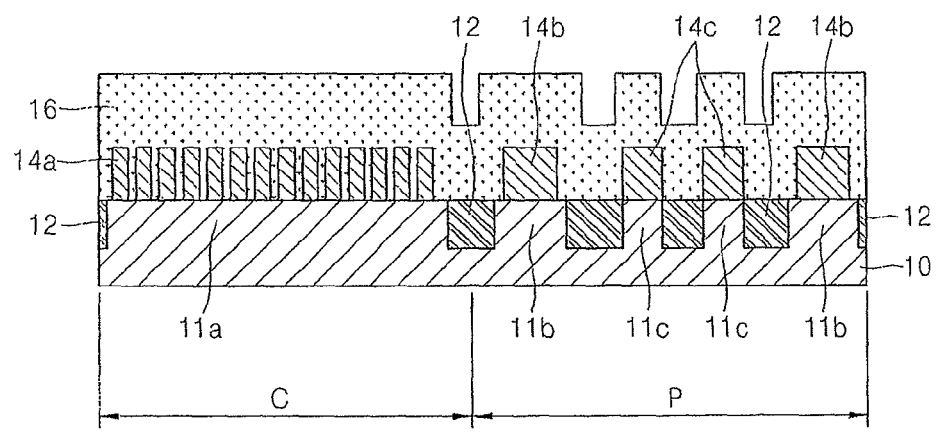
Figure 3:
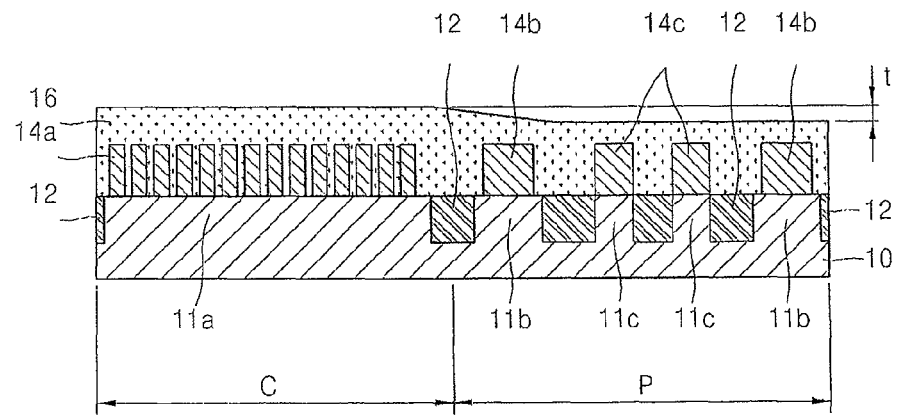
Figure 4:
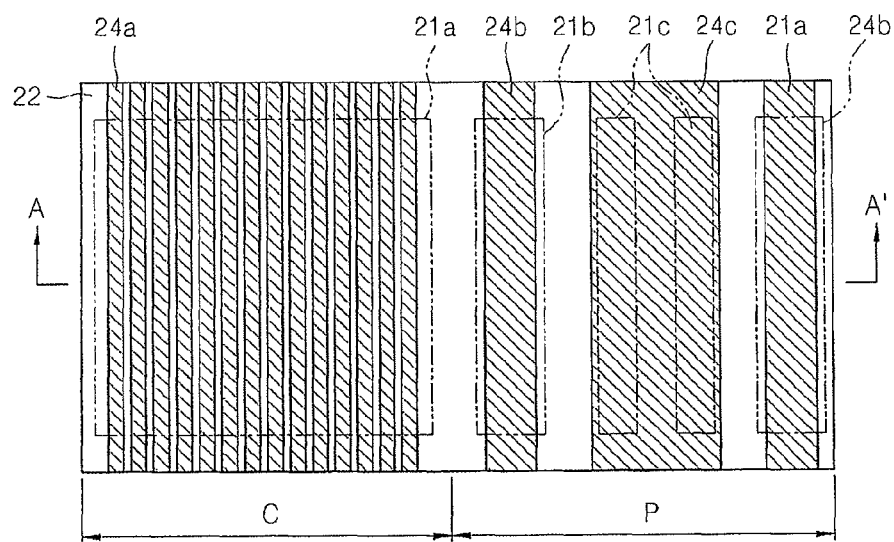
FIG. 4 is a plan view of a semiconductor device according to an embodiment of the present invention.
Figure 5:
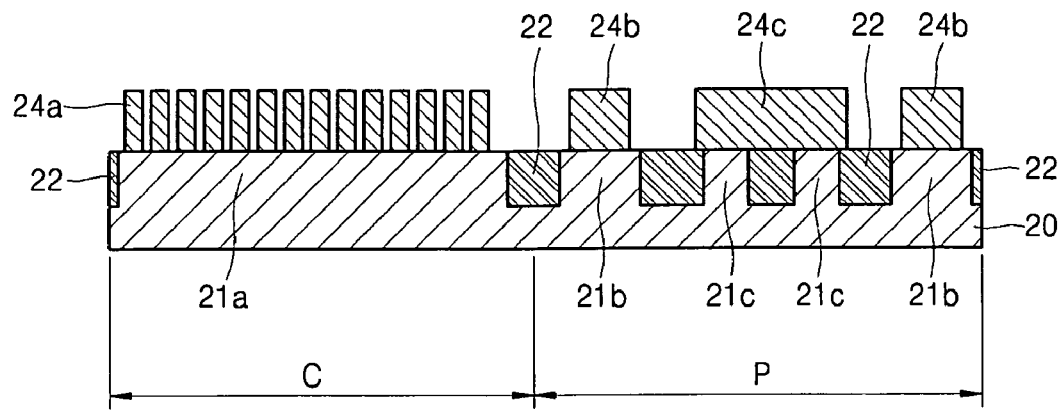
FIGS. 5 through 7 are sectional views illustrating a process for manufacturing the semiconductor device, taken along line A-A' of FIG. 4.
Figure 6:
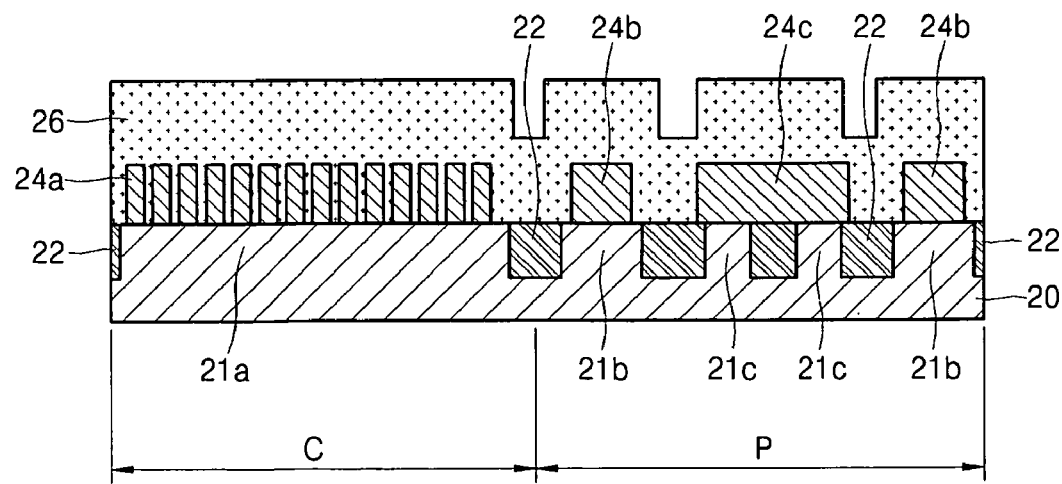
Figure 7:
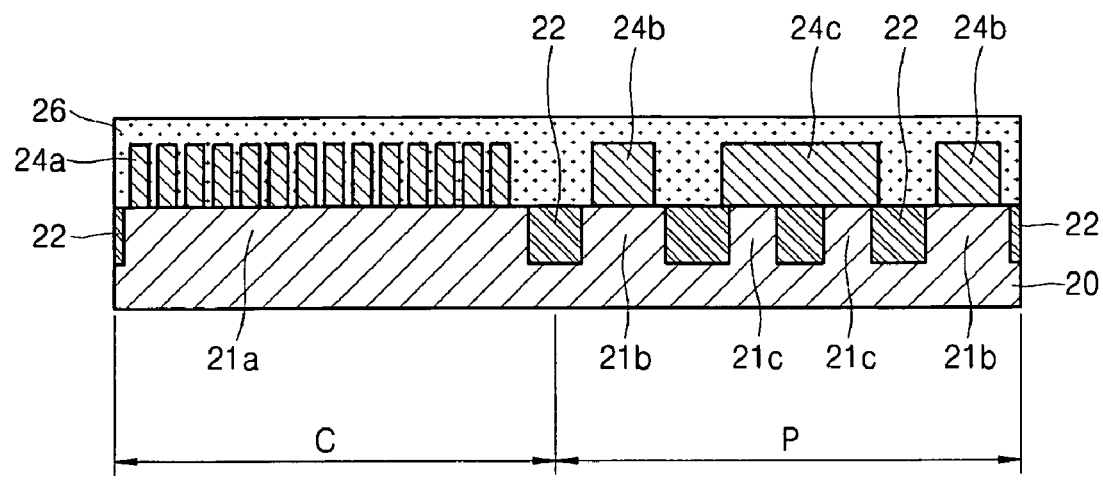

FIG. 4 is a plan view of a semiconductor device according to an embodiment of the present invention, and FIGS. 5 through 7 are sectional views illustrating a process FOR manufacturing the semiconductor device, taken along line A-A' of FIG. 4.

Referring to FIGS. 4 and 5, the top surface of a semiconductor substrate 20, which is, for example, formed of a silicon single crystal, is divided into two regions: a cell region C, on which semiconductor memory devices will be formed, and a peripheral region P, which is formed around the cell region C and on which some control devices and dummy devices will be formed. A real active region 21a, surrounded and defined by a device isolating region 22, is formed in the cell region C. A plurality of dummy active regions 21c, surrounded and defined by the device isolating region 22, are formed in the peripheral region P. Real active regions 21b are also formed in the peripheral region P. When the peripheral region P is formed as a single device isolating region without forming the plurality of dummy active regions 21c, chemical mechanical polishing cannot be performed smoothly due to a relatively large device isolating region when shallow trench isolation (STI) is applied in the peripheral region P, and thus a plurality of the dummy gates 24c, which have no relevance to circuit operations, are formed in the peripheral region P. Semiconductor devices such as a control device carrying out circuit operations, which is, for example, a transistor, may also be located in a certain area of the peripheral region P, and a plurality of real gate parts 24b can also be formed on the real active region 21b of the peripheral region P by having a gate insulation layer (not shown) therebetween.

As shown in FIG. 4, the dummy active regions 21c formed in the peripheral region P extend linearly in the present embodiment. The device isolating region 22 is formed by forming a mask pattern defining the device isolating region 22 on the top surface of the semiconductor substrate 20, forming a trench by etching a portion of the semiconductor substrate 20 by using the mask pattern as an etch mask, and filling the trench with insulating materials, such as an oxide and/or a nitride, through a gap filling operation. After the device isolating region 22 is formed, a gate insulation layer (not shown) is formed over the semiconductor substrate 20, a gate part forming material is formed to a predetermined thickness, and a gate part pattern is formed through a lithography operation.

As shown in FIGS. 4 and 5, the real gate parts 24a are densely formed on the real active regions 21a in the shape of line/space pattern in the cell region C. In the peripheral region P, the dummy gate parts 24c are formed on the dummy active region 21c having a linear shape in a stripe pattern. Each of the dummy gate parts 24c covers two of the dummy active regions 21c in the present embodiment. However, the present invention is not limited to that configuration, and each of the dummy gate parts 24c can cover two or more dummy active regions 21c. For example, n dummy active regions and (n−1) device isolating regions between the dummy-active regions can be either bundled by using one of the dummy gate parts or bundled by a plurality of the dummy gate parts. As the single dummy gate part covers a plurality of the dummy active regions 21c and device isolating regions 22, density of the dummy gate parts 24c in an overall area of the peripheral region P can be increased.

While only one dummy gate part 24c is shown in FIGS. 4 and 5 for simplicity of description, a plurality of the dummy gate parts 24c may be formed adjacent to each other. After the real gate parts 24a and 24b and the dummy gate parts 24c are formed, ions are implanted to expose a portion of the semiconductor substrate 20 by using the real gate parts 24a and 24b and the dummy gate parts 24c as an ion-implanting mask. Therefore, it may be preferable for each of the dummy gate parts 24c to completely cover the dummy active regions 21c below the dummy gate part 24c to prevent the dummy active regions 21c from becoming conductive due to ions being implanted into the dummy active regions 21 in a subsequent ion-implanting operation.

The number of dummy active regions corresponding to the number of dummy gate parts is increased to increase the area occupied by the dummy gate parts 24c in the peripheral area P, that is, to increase the density of the dummy gate parts 24c, because each of the dummy gate parts 24c corresponds to one of the dummy active regions 21c in a semiconductor device having a dummy gate in the prior art. While either each of the dummy active regions, or the device isolating region 22 surrounding each of the dummy active regions 21c needs to be minimized to increase the number of the dummy active regions 21 within the device isolating region having a limited area in the peripheral region P, there is a limit in making the patterns for the dummy active regions and the device isolating regions finer.

Also, the area of the device isolating region 22 between the dummy active regions 21c become smaller as the number and area of the dummy active regions 21c increase. Furthermore, it becomes less suitable for performing STI to form the device isolating region 22. However, since the dummy active regions 21c and the dummy gate parts 24c do not correspond to each other in a one-to-one basis, the density of the dummy active regions 21c and the density of the dummy gate parts 24c can be optimized separately. Therefore, after the dummy active regions 21c are formed in the density optimal for performing STI smoothly, the dummy gate parts 24c can be formed in any density concerning the density of the real gate parts 24a in the cell region C, where it is not necessary to concern the density of the dummy active regions 21c. The term 'density' here refers to a ratio of an area occupied by a certain component to the entire surface area. For example, the density of the real gate parts 24a in the cell region C refers to the ratio of the area occupied by the real gate parts 24a in the cell region C to the entire surface area of the cell region C.

Referring to FIG. 6, a thick interlayer insulation layer 26 is formed over the real gate parts 24a and the dummy gate parts 24c on the semiconductor substrate, wherein the interlayer insulation layer 26 may be formed of, for example, an oxide or a nitride. At this point, the interlayer insulation layer 26 in the cell region C is formed evenly due to the densely concentrated real gate parts 24a. Since the dummy gate parts 24c have a sufficient density, less of the material forming the interlayer insulation layer fills spaces between the dummy gate parts 24c, and thus the interlayer insulation layer 26 in the peripheral region P can also be formed evenly.

Referring to FIG. 7, CMP is performed on the interlayer insulation layer 26 to even the surface of the interlayer insulation layer 26. Since the density of the real gate parts 24a in the cell region C is not significantly different from the density of the dummy gate parts 24c in the peripheral region P, the volumes of slurries used for the CMP are nearly same in both regions C and P, and thus the loading effect can be prevented. Also, there is little level difference between the cell region C and the peripheral region P, and thus the evenness of entire surface is significantly improved.

Therefore, a circuit layer or other interlayer insulation layer (not shown), which is to be formed later, can be formed to be flat with little level difference between the cell region C and the peripheral region P, and thus the formation of circuit patterns on the layers can be performed successfully.

Figure 8:
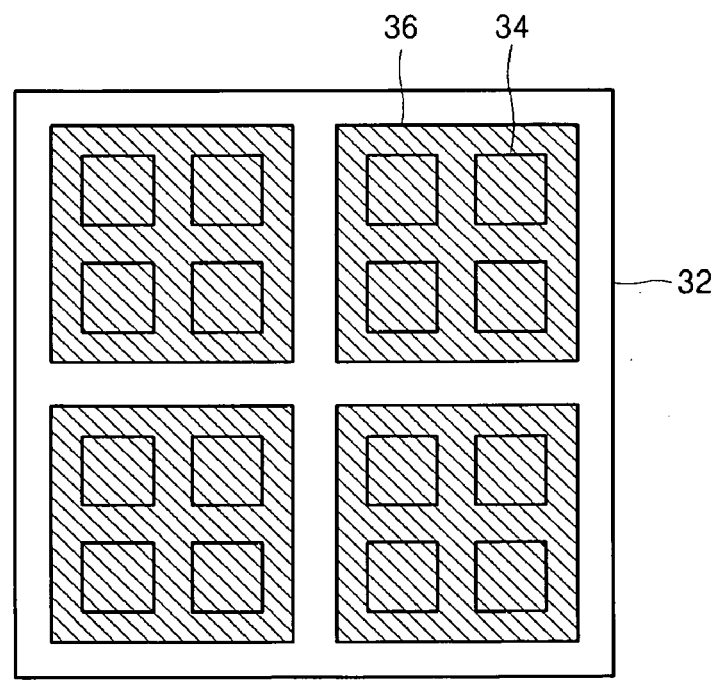
FIG. 8 is a plan view showing a positional relationship between dummy active regions and dummy gate parts in a peripheral region of a semiconductor device according to another embodiment of the present invention.

FIG. 8 is a plan view showing a positional relationship between dummy active regions 34 and dummy gate parts 36 in a peripheral region of a semiconductor device according to another embodiment of the present invention.

Referring to FIG. 8, while the dummy active regions 21c, surrounded by the device isolating region 22, are formed to extend linearly in the semiconductor device shown in FIG. 4, the dummy active regions 34 in the semiconductor device of the present embodiment are formed in island shapes by a device isolating region 32, and a plurality of the dummy active regions 34 are formed in matrix shape in the peripheral region. As described in the previous embodiment, the density of the dummy active regions 34 may be set to an optimal density for smoothly performing STI to isolate devices in the peripheral region. Thus, the STI can be performed smoothly without minimizing either size of the dummy active regions 34 or width of the device isolating region 36 between the dummy active regions 34.

The dummy active regions 34 arranged in matrix shape can be bundled by dummy gate parts 36 having appropriate sizes. Although a case in which four dummy active regions 34 are bundled by one dummy gate part 36 is shown in FIG. 8, the present invention is not limited thereto. The dummy gate parts 36 can be arranged in various combinations as long as each dummy gate part 36 can cover any number of the dummy active regions 34 and the number of the dummy active regions 34 is two or more. Also, it is advantageous that the dummy gate parts 36 are formed to have a specific size and arrangement such that a difference between the density of real gate parts in the cell region and the density of the dummy gate parts 36 is within a permissible range and is as small as possible to ensure surface evenness of an interlayer insulation layer, which is to be formed later, after performing CMP on the interlayer insulation layer.

Figure 9:
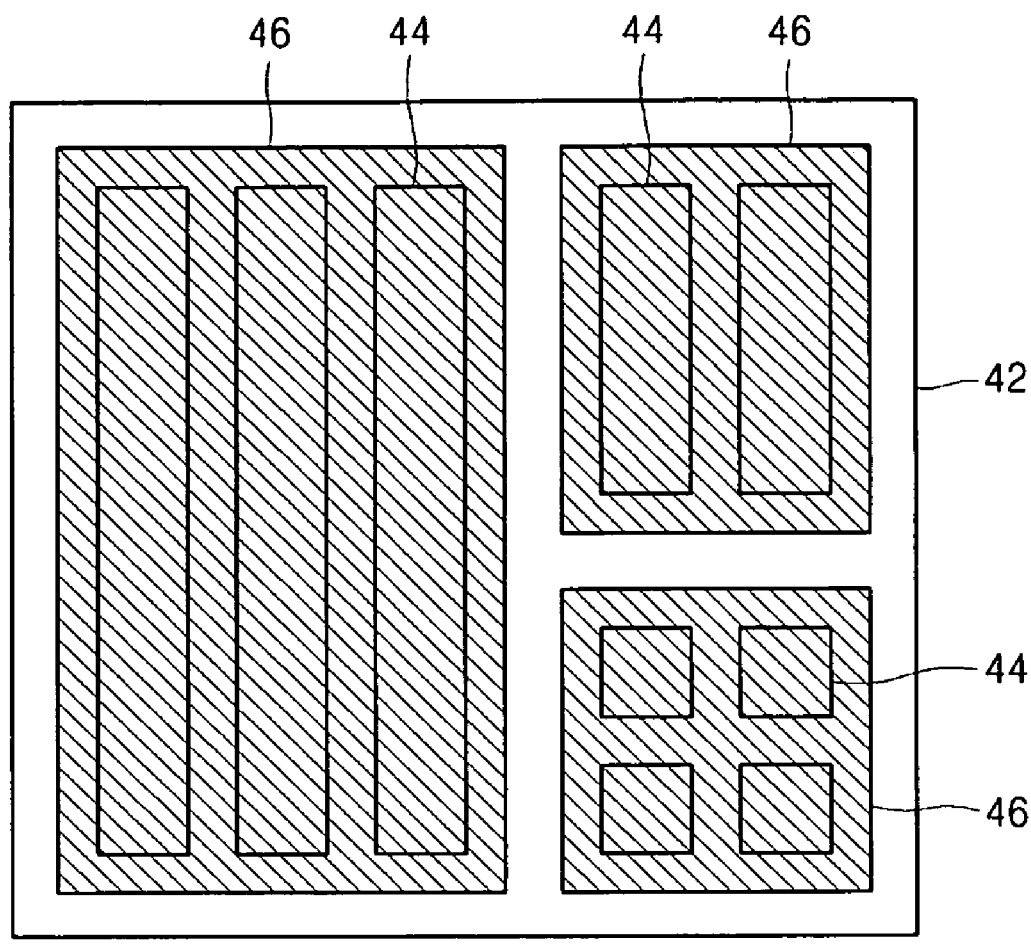
FIG. 9 is a plan view showing a positional relationship between dummy active regions and dummy gate parts in a peripheral region of a semiconductor device according to another embodiment of the present invention.

FIG. 9 is a plan view showing a positional relationship between dummy active regions 44 and dummy gate parts 46 in a peripheral region of a semiconductor device according to another embodiment of the present invention.

Referring to FIG. 9, the dummy active regions 44, defined by a device isolating region 42, are arranged in a line and island pattern, and the dummy gate parts 46 are arranged in various patterns in correspondence to the pattern of the dummy active regions 44.

While the embodiments of the present invention have been particularly shown and described, the invention may, however, be embodied in many different forms and should not be construed as being limited to the embodiments set forth herein. For example, the embodiments of the present invention have been described under an assumption that density of real gate parts in a cell region of a semiconductor device is greater than density of dummy gate parts in a peripheral region of the semiconductor device. However, when density of real gate parts in cell region of a semiconductor device is smaller than density of dummy gate parts in peripheral region of the semiconductor device, dummy gate parts can be further formed in the cell region to minimize density difference between the gate parts of both of the regions, and the dummy gate parts can be formed in various sizes and shapes in correspondence to dummy active regions, which may be formed in the cell region.

Furthermore, dummy active regions formed in a peripheral region of a semiconductor substrate and dummy gate parts formed on the dummy active regions are described in the embodiments of the present invention. However, if CMP is performed on a material layer within stacked layers of a semiconductor device as may be required, it is clear that dummy gate parts can be formed in a cell region and/or the peripheral region in various sizes and shapes according to the present invention prior to the CMP operation.

What is claimed is:

1. A semiconductor device comprising:
   a semiconductor substrate comprising a cell region and a peripheral region surrounding the cell region;
   a plurality of dummy active regions surrounded by a device isolating region in the peripheral region and formed apart from each other and electrically isolated from each other; and
   at least one dummy gate part which is formed on a portion of the device isolating region located between the dummy active regions and is formed on adjacent dummy active regions, each dummy gate part covering two or more of the dummy active regions,
   wherein the dummy active regions are covered by the dummy gate part so that the dummy active regions are not exposed outside the dummy gate part.

2. The semiconductor device of claim 1, wherein real gate parts are formed in the cell region in correspondence to the dummy gate part in the peripheral region, and the real gate parts and the dummy gate part are formed of the same material.

3. The semiconductor device of claim 1, wherein the dummy active regions are formed to have a rectangular pattern, and the dummy gate parts are formed to have a stripe pattern in correspondence to the dummy active regions.

4. The semiconductor device of claim 1, wherein the dummy active regions are formed to have a pattern of a plurality of islands, and the dummy gate part is formed to have a rectangular panel shape covering the dummy active regions in the island pattern.

5. The semiconductor device of claim 1, further comprising:
   at least one real active region; and
   at least one real gate part formed in correspondence to the real active region, in the peripheral region.

6. A semiconductor device comprising:
   a semiconductor substrate comprising a cell region and a peripheral region surrounding the cell region;
   a first dummy active region surrounded by a device isolating region in the peripheral region;
   a second dummy active region surrounded by the device isolating region in the peripheral region and electrically isolated from the first dummy active region; and
   a dummy gate part covering the first dummy active region, the second dummy active region, and a portion of the device isolating region, the portion of the device isolating region corresponding to an entire region of the device isolating region contacting the first dummy active region and the second dummy active region.

7. The semiconductor device of claim 6, wherein an entire region of the first dummy active region and the second dummy active region is not exposed outside the dummy gate part.

8. The semiconductor device of claim 6, wherein the portion of the device isolating region is not exposed outside the dummy gate part.

9. A semiconductor device comprising:
   a semiconductor substrate comprising a cell region and a peripheral region surrounding the cell region;
   a plurality of dummy active regions surrounded by a device isolating region in the peripheral region and formed apart from each other and electrically isolated from each other; and
   at least one dummy gate part which is formed on a portion of the device isolating region,
   wherein the dummy gate part extends to cover an entire region of two or more of the plurality of dummy active regions.

* * * * *